(12) United States Patent
Kim et al.

(10) Patent No.: US 10,211,322 B1
(45) Date of Patent: Feb. 19, 2019

(54) SEMICONDUCTOR DEVICE INCLUDING CHANNEL PATTERN AND MANUFACTURING METHOD THEREOF

(71) Applicant: SAMSUNG ELECTRONICS CO., LTD., Suwon-si, Gyeonggi-do (KR)

(72) Inventors: Jin Bum Kim, Hwaseong-si (KR); Tae Jin Park, Hwaseong-si (KR); Jong Min Lee, Hwaseong-si (KR); Seok Hoon Kim, Hwaseong-si (KR); Dong Chan Suh, Hwaseong-si (KR); Jeong Ho Yoo, Hwaseong-si (KR); Ha Kyu Seong, Hwaseong-si (KR); Dong Suk Shin, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/896,277

(22) Filed: Feb. 14, 2018

(30) Foreign Application Priority Data

Aug. 21, 2017 (KR) ........................ 10-2017-0105370

(51) Int. Cl.
*H01L 29/66* (2006.01)
*H01L 29/40* (2006.01)
*H01L 29/78* (2006.01)

(52) U.S. Cl.
CPC ........ *H01L 29/6681* (2013.01); *H01L 29/401* (2013.01); *H01L 29/785* (2013.01); *H01L 2029/7858* (2013.01)

(58) Field of Classification Search
CPC .. H01L 29/6681; H01L 29/401; H01L 29/785
See application file for complete search history.

(56) References Cited

U.S. PATENT DOCUMENTS

| | | | |
|---|---|---|---|
| 7,485,520 B2 | 2/2009 | Zhu et al. | |
| 8,551,833 B2 | 10/2013 | Chang et al. | |
| 9,263,295 B2 | 2/2016 | Wang et al. | |
| 9,484,406 B1 | 11/2016 | Sun et al. | |
| 9,496,341 B1 | 11/2016 | Cheng et al. | |
| 9,515,138 B1 | 12/2016 | Doris et al. | |
| 2014/0001441 A1* | 1/2014 | Kim | H01L 29/0673 257/29 |
| 2015/0069327 A1 | 3/2015 | Cheng et al. | |
| 2015/0069328 A1* | 3/2015 | Leobandung | H01L 29/775 257/24 |
| 2015/0084041 A1* | 3/2015 | Hur | H01L 29/7832 257/43 |
| 2015/0263155 A1* | 9/2015 | Fujimoto | H01L 29/7786 257/76 |
| 2015/0263159 A1* | 9/2015 | Ching | H01L 29/785 257/77 |
| 2016/0111513 A1 | 4/2016 | Liu et al. | |
| 2016/0379981 A1 | 12/2016 | Balakrishnan et al. | |

* cited by examiner

*Primary Examiner* — Christine Enad
(74) *Attorney, Agent, or Firm* — Lee & Morse, P.C.

(57) ABSTRACT

A semiconductor device and a method of manufacturing a semiconductor device, the semiconductor device including a channel pattern on a substrate, the channel pattern extending in a first direction; a gate pattern on the substrate, the gate pattern extending in a second direction crossing the first direction and surrounding the channel pattern; and an interface layer between the channel pattern and the gate pattern, the interface layer being formed on at least one surface of an upper surface and a lower surface of the channel pattern.

16 Claims, 17 Drawing Sheets

SEMICONDUCTOR DEVICE INCLUDING CHANNEL PATTERN AND MANUFACTURING METHOD THEREOF

CROSS-REFERENCE TO RELATED APPLICATION

Korean Patent Application No. 2017-105370, filed on Aug. 21, 2017, in the Korean Intellectual Property Office, and entitled: "Semiconductor Device Including Channel Pattern and Manufacturing Method Thereof," is incorporated by reference herein in its entirety.

BACKGROUND

1. Field

Embodiments relate to a semiconductor device including a channel pattern and a method of manufacturing the same.

2. Description of the Related Art

In order to implement high capacity, high performance, and highly integrated devices, demand for miniaturization of semiconductor devices is being increased. In order to increase the degree of integration of semiconductor devices per unit area according to the increased demand, research on reducing sizes of the semiconductor devices and reducing a distance between the semiconductor devices has been progressing. In order to achieve miniaturization of semiconductor devices, a fin field effect transistor (hereinafter, referred to as a finFET) having a fin structure formed to vertically protrude like a fish fin has been considered.

Due to the structural characteristics of the finFET, the finFET may secure an effective channel length to help prevent a short channel effect and may increase a width of a gate pattern to increase a magnitude of an operating current.

SUMMARY

Embodiments are directed to a semiconductor device including a channel pattern and a method of manufacturing the same The embodiments may be realized by providing a semiconductor device including a channel pattern on a substrate, the channel pattern extending in a first direction; a gate pattern on the substrate, the gate pattern extending in a second direction crossing the first direction and surrounding the channel pattern; and an interface layer between the channel pattern and the gate pattern, the interface layer being formed on at least one surface of an upper surface and a lower surface of the channel pattern.

The embodiments may be realized by providing a semiconductor device including a channel pattern on a substrate, the channel pattern extending in a first direction; a gate pattern on the substrate, the gate pattern extending in a second direction crossing the first direction and surrounding the channel pattern; and an interface layer containing carbon, the interface layer being between the channel pattern and the gate pattern and on at least one surface of an upper surface and a lower surface of the channel pattern, wherein the interface layer includes a first interface layer on the channel pattern; and a second interface layer on the first interface layer.

The embodiments may be realized by providing a method of manufacturing a semiconductor device, the method including forming a sacrificial film on a substrate; forming an interface film on the sacrificial film such that the interface film includes carbon; forming a channel film on the interface film; removing the sacrificial film; and forming a gate pattern such that the gate pattern surrounds the channel film.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a semiconductor device and a method of manufacturing the semiconductor device according to exemplary embodiments will be described with reference to the accompanying drawings.

Figure 1:
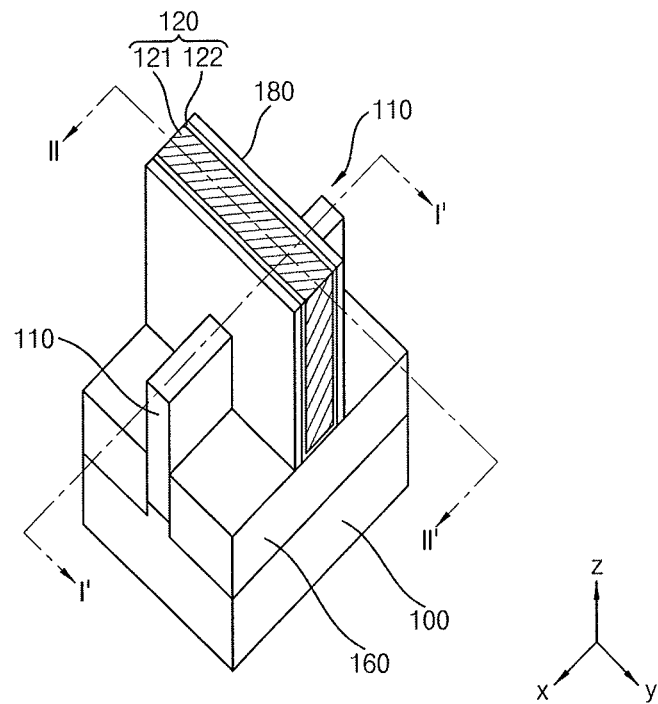
FIG. 1 illustrates a perspective view of a structure of a semiconductor device according to an exemplary embodiment.
Figure 2:
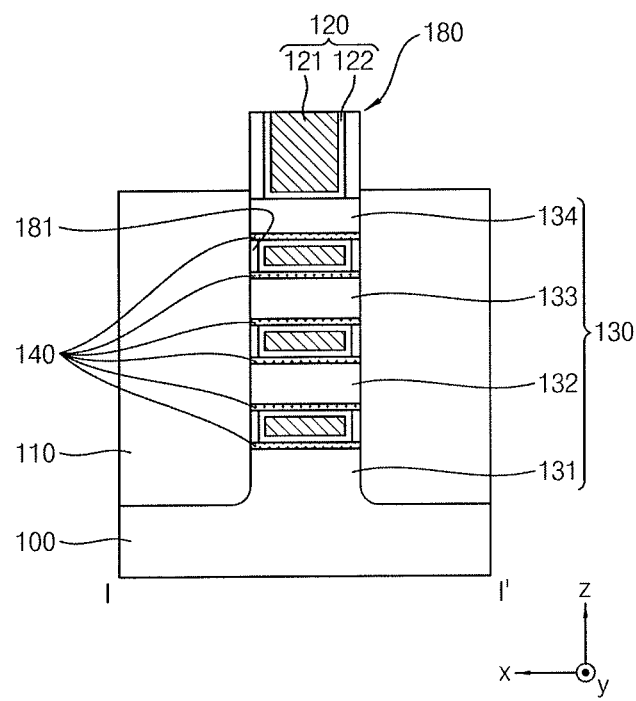
FIG. 2 illustrates a cross-sectional view taken along line I-I' of FIG. 1.
Figure 3:
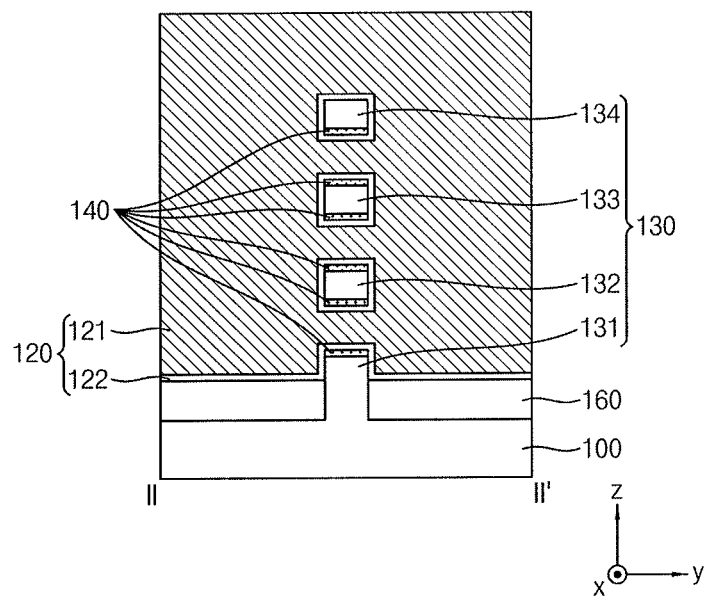
FIG. 3 illustrates a cross-sectional view taken along line II-II' of FIG. 1.

FIG. 1 illustrates a perspective view of a structure of a semiconductor device according to an exemplary embodiment. FIG. 2 illustrates a cross-sectional view taken along line I-I' of FIG. 1. FIG. 3 illustrates a cross-sectional view taken along line II-II' of FIG. 1.

Referring to FIGS. 1 to 3, the semiconductor device according to the exemplary embodiment may include a substrate 100, a pair of source and drain patterns 110 (hereinafter, referred to as source/drain patterns), a gate pattern 120, channel pattern 130 (e.g., a plurality of channel patterns), and an interface layer 140. The semiconductor device may further include a device isolation film 160 and a spacer 180. The semiconductor device may be a fin field-effect transistor (finFET).

The substrate 100 may be provided at a lower portion of the semiconductor device. The substrate 100 may provide formation regions of the respective components by making heights (e.g., thicknesses) of regions in which the source/drain patterns 110, the channel pattern 130, the device isolation film 160, and the like are formed may be different from each other. For example, a height of the substrate 100 in a region in which the source/drain patterns 110 are formed may be lower than a height of the substrate 100 in a region in which the gate pattern 120 is formed. A height of the substrate 100 in a region in which the device isolation film 160 is formed may be lower than a height of the substrate 100 in a region in which the channel pattern 130 are formed.

The substrate 100 may be a semiconductor substrate or a compound semiconductor substrate containing, e.g., silicon (Si), germanium (Ge), silicon germanium (SiGe), or the like.

The source/drain patterns 110 may have a three-dimensional shape having a predetermined thickness, width, and length. For example, the pair of source/drain patterns 110 may have a rectangular parallelepiped shape extending (e.g., lengthwise) in a first direction, may protrude from a surface of the substrate 100, and may be spaced apart from each other. Heights of upper surfaces of the source/drain patterns 110 may be higher than heights of the channel pattern 130, and the source/drain patterns 110 may be elevated source/drains.

When the semiconductor device is an n-channel metal-oxide-semiconductor (N-MOS) transistor, the source/drain patterns 110 may include silicon or silicon carbide (SiC). When the semiconductor device is a p-channel metal-oxide-semiconductor (P-MOS) transistor, the source/drain patterns 110 may include germanium or silicon germanium.

The gate pattern 120 may surround the channel pattern 130. The gate pattern 120 may be between the pair of source/drain patterns 110 in a second direction crossing the first direction in which the channel pattern 130 extends (e.g., lengthwise). A height of an uppermost surface of the gate pattern 120 may be higher than the height of the source/drain patterns 110. The gate pattern 120 may protrude more or higher than the source/drain patterns 110 in a vertical direction.

The gate pattern 120 may include a gate electrode 121 and a gate dielectric layer 122.

The gate electrode 121 may be formed between the channel pattern 130 and on the substrate 100. For example, the gate electrode 121 may be formed on a fourth channel 134, between the fourth channel 134 and a third channel 133, between the third channel 133 and a second channel 132, between the second channel 132 and a first channel 131, and on an upper surface of the device isolation film 160 formed on the substrate 100.

The gate electrode 121 may include, e.g., polysilicon doped with an impurity or a metal such as nickel (Ni), tungsten (W), titanium (Ti), or tantalum (Ta), and may include a conductive material such as titanium nitride (TiN), tantalum nitride (TaN), titanium carbide (TiC), tantalum carbide (TaC), or the like.

The gate dielectric layer 122 may be formed between the gate electrode 121 and the channel pattern 130. For example, the gate dielectric layer 122 may be formed between the gate electrode 121 and both side surfaces and upper and lower portions of each of the channel pattern 130. The gate dielectric layer 122 may be formed on the upper surface of the device isolation film 160 and an inner surface of the spacer 180. The gate dielectric layer 122 may be formed between the source/drain patterns 110 and the gate electrode 121.

The gate dielectric layer 122 may include a high-k material having a higher dielectric constant than silicon oxide. For example, the gate dielectric layer 122 may include hafnium oxide ($HfO_2$), lanthanum oxide ($La_2O_3$), zirconium oxide ($ZrO_2$), or tantalum oxide ($Ta_2O_5$). The gate dielectric layer 122 may include thermally oxidized silicon.

The channel pattern 130 may extend (e.g., lengthwise) in the first direction on the substrate 100. The channel pattern 130 may include at least one channel. The channel pattern 130 may be formed between the source/drain patterns 110 and spaced a predetermined distance from each other in the vertical direction. The channel pattern 130 may be in contact with inner surfaces of the source/drain patterns 110 to connect the source/drain patterns 110 to each other. A plurality of channels may be disposed in a line in a vertical direction. For example, the channel pattern 130 may have a shape having a small width and height and extending in one direction, and a vertical cross section of the channel pattern 130 may be substantially rectangular (see FIG. 3). For example, the channel pattern 130 may be a nano-wire.

The channel pattern 130 may include, e.g., silicon (Si), silicon germanium (SiGe), germanium (Ge), or a combination thereof.

The channel pattern 130 may include the first channel 131 on the substrate 100, the second channel 132 on the first channel 131, the third channel 133 on the second channel 132, and the fourth channel 134 on the third channel 133. In an implementation, as illustrated in FIGS. 2 and 3, four channel patterns 130 may be included. In an implementation, two channel patterns 130, three channel patterns 130, or five or more channel patterns 130 may be included. Side surfaces of the channel pattern 130 may be in contact with the gate pattern 120. In an implementation, the side surfaces of each of the first channel 131, the second channel 132, the third channel 133, and the fourth channel 134 may be in direct contact with the gate dielectric layer 122.

For example, the first channel 131 may be formed by protruding a part of the substrate 100 and may be in direct contact with (e.g., may be monolithically continuous with) the substrate 100. The substrate 100 in a region in which the channel pattern 130 is formed may partially protrude, and the first channel 131 may be formed as an upper surface and both side surfaces of the protruding portion of the substrate 100 surrounded by the gate pattern 120. The first channel 131 may be formed of the same material as the substrate 100. For example, when the substrate 100 includes silicon, the first channel 131 may include silicon. When the substrate 100 includes silicon germanium, the first channel 131 may include silicon germanium. When the substrate 100 includes germanium, the first channel 131 may include germanium.

The interface layer 140 may be disposed between the channel pattern 130 and the gate pattern 120 and may be on at least one surface of an upper surface and a lower surface of each of the channel patterns 130. For example, the interface layer 140 may be disposed between the channel pattern 130 and the gate dielectric layer 122. The interface layer 140 may be defined by facing surfaces between the channel patterns 130 and may be defined between the channel pattern 130 and the substrate 100. Here, the facing surfaces between the channel patterns 130 refer to surfaces of the channel patterns 130 facing each other. For example, the interface layer 140 may be formed between the substrate 100 and the first channel 131, between the first channel 131 and the second channel 132, between the second channel 132 and the third channel 133, and between the third channel 133 and the fourth channel 134.

The interface layer 140 may be in direct contact with one channel pattern 130 adjacent thereto among the channel patterns 130. For example, the interface layer 140 may be in direct contact with an upper surface of the first channel 131, an upper surface and a lower surface of the second channel 132, an upper surface and a lower surface of the third channel 133, and a lower surface of the fourth channel 134.

The interface layer 140 may have a smaller thickness than the channel pattern 130 adjacent thereto among the channel patterns 130. For example, the interface layer 140 may have a smaller thickness than each of the first to fourth channels 131, 132, 133, and 134 in direct contact therewith.

The interface layer 140 may contain a blocking material. In an implementation, the blocking material may help reduce and/or prevent diffusion of germanium. For example, the blocking material may help reduce and/or prevent germanium contained in a region adjacent to the channel pattern 130 from diffusing into the channel pattern 130, or may help reduce and/or prevent germanium contained in the channel pattern 130 from diffusing into a region adjacent thereto. A flatness of a channel surface may be increased by the blocking material.

When the channel pattern 130 contains silicon germanium, germanium, or a combination thereof, a concentration of germanium in the interface layer 140 may be increased (e.g., in a direction) toward the channel pattern 130 (e.g., to form a concentration gradient). Germanium contained in the channel pattern 130 may be diffused into the region adjacent to the channel pattern 130, and the concentration of germanium in the interface layer 140 may be increased toward the channel pattern 130.

When the channel pattern 130 contains silicon, a concentration of germanium in the interface layer 140 may be decreased (e.g., in a direction) toward the channel pattern 130. Germanium contained in the region adjacent to the channel pattern 130 may be diffused into the channel pattern 130, and the concentration of germanium in the interface layer 140 may be decreased toward the channel pattern 130.

In an implementation, the blocking material may contain, e.g., carbon (C). In an implementation, the interface layer 140 may include, e.g., a silicon carbide (SiC) layer, a silicon germanium carbide (SiGeC) layer, or a combination thereof. In an implementation, the interface layer 140 may contain, e.g., boron (B) instead of carbon.

The device isolation film 160 may be disposed on the substrate 100 while being in contact with lower portions of side surfaces of the source/drain patterns 110. For example, an upper surface of the device isolation film 160 may be located at a higher level than lower surfaces of the source/drain patterns 110, and a lower surface of the device isolation film 160 may be located at a lower level than the lower surfaces of the source/drain patterns 110. The device isolation film 160 may include an insulating material. For example, the device isolation film 160 may include any one of an oxide film, a nitride film, and an oxynitride film.

The spacer 180 may be formed on an uppermost channel of the channel pattern 130 and may be in contact with both side surfaces of the gate pattern 120. In an implementation, the spacer 180 may be formed in direct contact with the fourth channel 134 and may be in direct contact with side surfaces of the gate dielectric layer 122. The spacer 180 may include silicon oxide (SiO) or silicon nitride (SiN). In an implementation, the spacer 180 may be formed as a plurality of layers.

In an implementation, an inner spacer 181 may be formed in a space between the channel patterns 130 while being in contact with side surfaces of the source/drain patterns 110. For example, the inner spacer 181 may be in contact with the side surfaces of the gate dielectric layer 122 and the side surfaces of the source/drain patterns 110 while being in contact with an upper surface and a lower surface of the channel pattern 130.

The inner spacer 181 may be formed of a different material from that of the spacer 180. The spacer 180 may be made of an insulating film which cannot be used for seeding and epitaxial growth of semiconductor atoms, and the inner spacer 181 may be made of an insulating film which can be used for seeding and epitaxial growth of semiconductor atoms. For example, the spacer 180 may be formed with a silicon nitride film, and the inner spacer 181 may be formed with a silicon nitride film containing atoms consisting of oxygen (O) atoms, boron (B) atoms, carbon (C) atoms, or a combination thereof.

The inner spacer 181 may include a plurality of layers. For example, the inner spacer 181 may include a plurality of layers selected from air space, SiN, SiCN, SiBN, SiON, SiOCN, SiBCN, SiOC, and $SiO_2$ layers.

Figure 4:
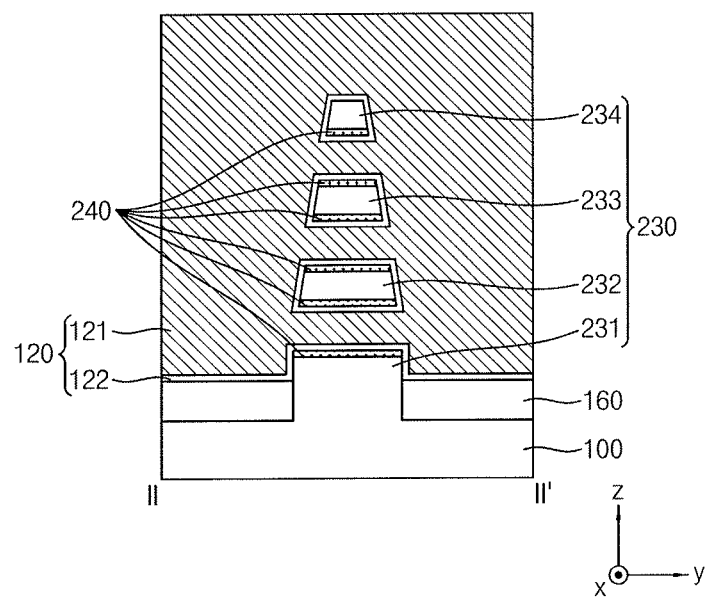
FIG. 4 illustrates a cross-sectional view corresponding to line II-II' of FIG. 1 in an exemplary embodiment.

Next, a semiconductor device according to an exemplary embodiment will be described in detail with reference to FIG. 4. FIG. 4 illustrates a cross-sectional view corresponding to line II-II' of FIG. 1.

A cross section of each of channel pattern 230 may be substantially trapezoidal, e.g., may have a trapezoidal shape. A shape or a size of the cross section of the channel pattern 230 may be appropriately changed to a suitable shape or size that may help improve an electrical characteristic of the semiconductor device.

Areas of interface layers 240 may be different from each other. For example, an area of the interface layer 240 formed on an upper surface of a first channel 231 may be the largest, and an area of the interface layer 240 formed on a lower surface of a fourth channel 234 may be the smallest.

Next, a semiconductor device according to an exemplary embodiment will be described in detail with reference to FIGS. 5 and 6.

Figure 5:
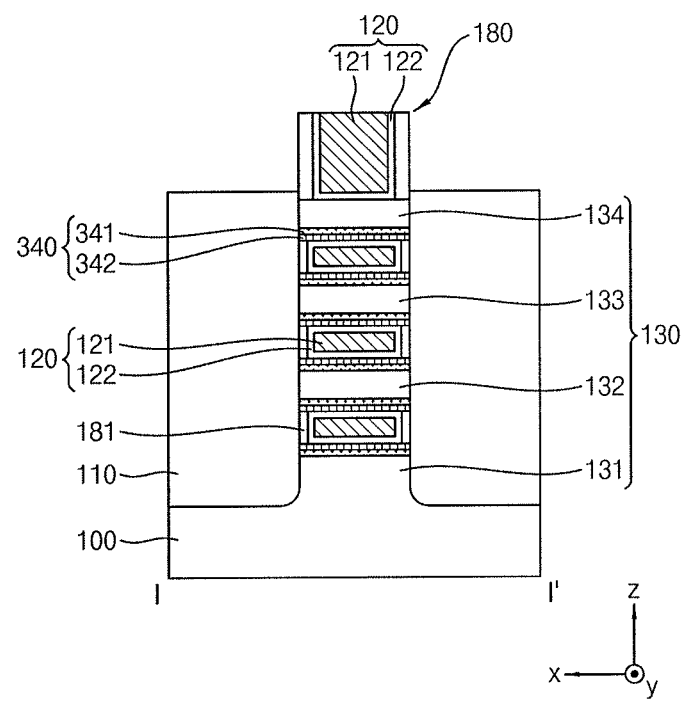
FIGS. 5 and 6 illustrate cross-sectional views respectively corresponding to lines I-I' and II-II' of FIG. 1, in an exemplary embodiment.
Figure 6:
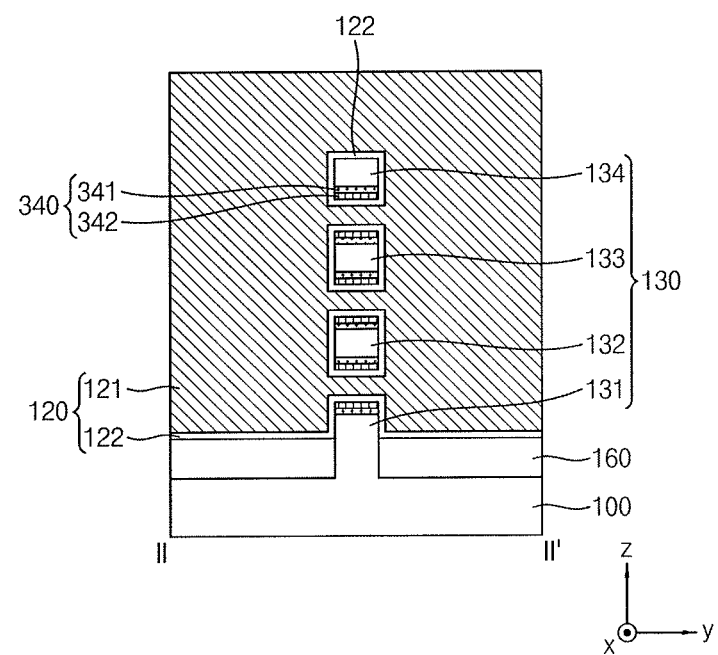

FIGS. 5 and 6 illustrate the semiconductor device according to the exemplary embodiment. FIGS. 5 and 6 illustrate cross-sectional views corresponding to lines I-I' and II-II' of FIG. 1, respectively. Descriptions of components identical to the components described in FIGS. 1 to 3 may be omitted or briefly given.

Interface layers 340 may each include a first interface layer 341 and a second interface layer 342. In an implementation, as illustrated in FIGS. 5 and 6, two interface layers (the first and second interface layers 341 and 342) may be included. In an implementation, the interface layers 340 may include three or more layers in consideration of a size and performance of the semiconductor device.

The first interface layer 341 may be formed on facing surfaces between the channel patterns 130, and the second interface layer 342 may be formed on the first interface layer 341. For example, the first interface layer 341 may be in direct contact with the upper surface of the first channel 131, the upper surface and lower surface of the second channel 132, the upper surface and lower surface of the third channel 133, and the lower surface of the fourth channel 134.

The second interface layer 342 may be in direct contact with and formed on facing surfaces between the first interface layers 341. The gate dielectric layer 122 may be in direct contact with and formed on the second interface layer 342. The first interface layer 341 may be formed between the channel pattern 130 and the second interface layer 342, and the second interface layer 342 may be formed between the first interface layer 341 and the gate dielectric layer 122. In an implementation, the channel pattern 130, the first interface layer 341, the second interface layer 342 and the gate dielectric layer 122 may be disposed in the order described.

In an implementation, the first interface layer 341 and the second interface layer 342 may contain carbon as a blocking material. In an implementation, the first interface layer 341 and the second interface layer 342 may include a silicon carbide layer, a silicon germanium carbide layer, or a combination thereof.

The first interface layer 341 and the second interface layer 342 may selectively include a silicon carbide layer or a silicon germanium carbide layer according to a material contained in the channel pattern 130. For example, when the channel pattern 130 includes germanium, silicon germanium, or a combination thereof, the first interface layer 341 may include a silicon germanium carbide layer, and the second interface layer 342 may include a silicon carbide layer. When the channel pattern 130 includes silicon, the first interface layer 341 may include a silicon carbide layer, and the second interface layer 342 may include a silicon germanium carbide layer. In an implementation, the first interface layer 341 and the second interface layer 342 may not contain carbon and may instead contain boron.

Figure 7:
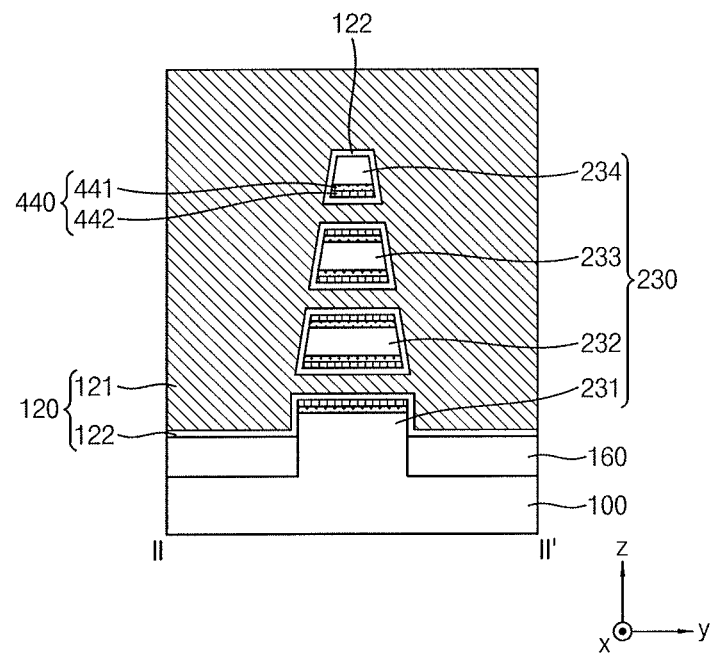
FIG. 7 illustrates a cross-sectional view corresponding to line II-II' of FIG. 1 in an exemplary embodiment.

Next, a semiconductor device according to an exemplary embodiment will be described in detail with reference to FIG. 7. FIG. 7 illustrates a cross-sectional view corresponding to line II-II' of FIG. 1.

A cross section of each of the channel patterns 230 may be substantially trapezoidal, e.g., may have a trapezoidal shape. Interface layers 440 may include a first interface layer 441 and a second interface layer 442. An area of the first interface layer 441 formed on an upper surface of each of the channel patterns 230 may be greater than an area of the second interface layer 442 thereon. An area of the first interface layer 441 formed on a lower surface of each of the channel pattern 230 may be smaller than the area of the second interface layer 442 thereunder.

Next, a semiconductor device according to an exemplary embodiment will be described in detail with reference to FIGS. 8 and 9.

Figure 8:
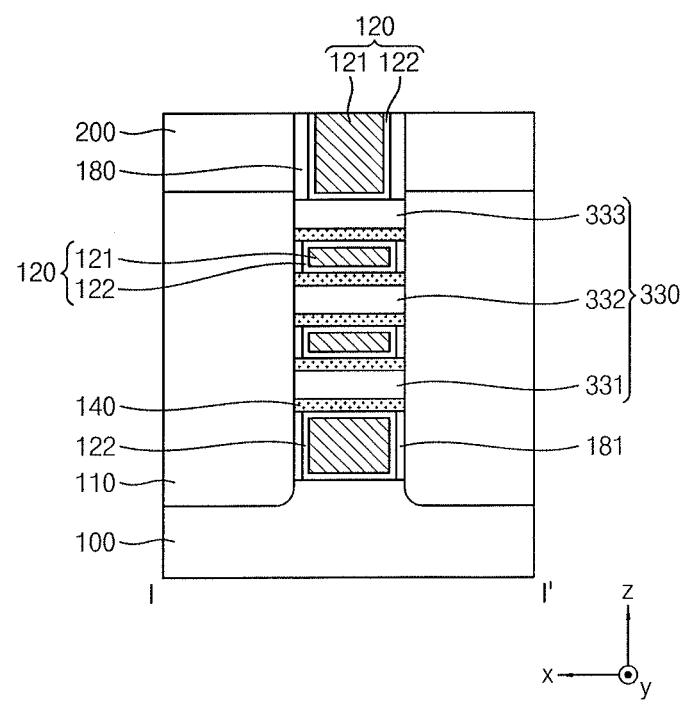
FIGS. 8 and 9 illustrate cross-sectional views corresponding to lines I-I' and II-II' of FIG. 1, respectively, in an exemplary embodiment.
Figure 9:
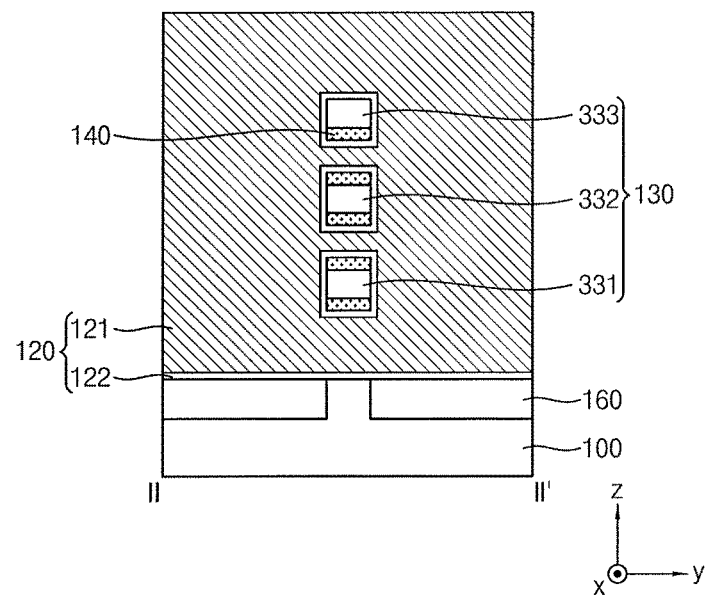

FIGS. 8 and 9 illustrate the semiconductor device according to the exemplary embodiment. FIG. 8 illustrates a cross-sectional view corresponding to line I-I' of FIG. 1. FIG. 9 illustrates a cross-sectional view corresponding to line II-IP of FIG. 1. Descriptions of components identical to the components described in FIGS. 1 to 3 may be omitted or briefly given.

The substrate 100 may protrude by a predetermined height in a region in or on which the channel pattern 330 is formed. The device isolation film 160 may be formed on the substrate 100 as described above, and a height of an upper surface of the device isolation film 160 may be substantially the same as a height of the substrate 100 in a region in which the channel pattern 330 are formed. The upper surface of the substrate 100 may be covered by the gate dielectric layer 122.

The channel pattern 330 may include first to third channels 331, 332, and 333.

The first channel 331 may connect the source/drain patterns 110 to each other and may be spaced apart from the substrate 100. An outer surface of the first channel 331 may be surrounded by the gate pattern 120. For example, the gate dielectric layer 122 may be formed on an upper surface, a lower surface, and both side surfaces of the first channel 331. The gate pattern 120, e.g., the gate electrode 121 and the gate dielectric layer 122, may be formed between the substrate 100 and the first channel 331. A shape of a cross section of each of the first to third channels 331, 332, and 333 may be rectangular as illustrated in FIG. 9, or may be trapezoidal as illustrated in FIGS. 4 and 7.

The first channel 331 may be formed using a different material from that of the substrate 100. In an implementation, the first channel 331 may be formed of silicon, and the substrate 100 may be formed of germanium. In an implementation, the first channel 331 may be formed of silicon germanium or germanium, and the substrate 100 may be formed of silicon. In an implementation, the first channel 331 and the substrate 100 may be formed using the same material.

The second channel 332 may be formed between the source/drain patterns 110 and disposed on the first channel 331. The third channel 333 may be formed between the source/drain patterns 110 and disposed on the second channel 332.

The interface layer 140 may be formed between the gate pattern 120 and each of the first to third channels 331, 332, and 333 and between the gate pattern 120 and the substrate 100. The interface layer 140 may be formed between the substrate 100 and the first channel 331 and between the first to third channels 331, 332, and 333. For example, the interface layer 140 may be directly formed on an upper surface and a lower surface of the first channel 331, an upper surface and a lower surface of the second channel 332, and a lower surface of the third channel 333.

In an implementation, the interface layer 140 may be formed as a single layer (see FIGS. 2 to 5) and may include a silicon carbide layer, a silicon germanium carbide layer, or a combination thereof. In an implementation, the interface layer 140 may be formed as a plurality of layers (see FIGS. 6 and 7). The silicon carbide layer or the silicon germanium carbide layer may be selected according to the material contained in the channel pattern 330.

Figure 10:
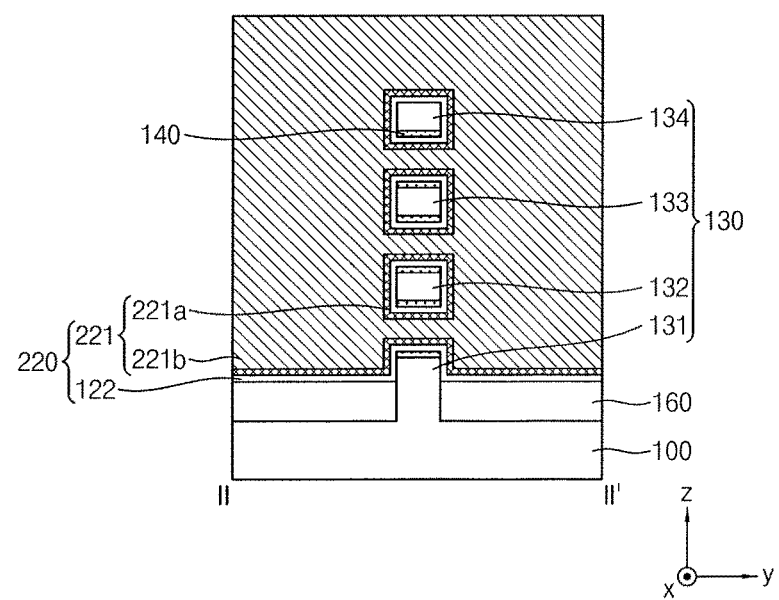
FIG. 10 illustrates a cross-sectional view corresponding to line II-II' of FIG. 1 in an exemplary embodiment.

FIG. 10 illustrates a semiconductor device according to an exemplary embodiment. A gate electrode 221 may be formed as a plurality of electrode layers. The gate electrode may include a first gate electrode 221a and a second gate electrode 221b. The first gate electrode 221a may be formed along a circumference of the gate dielectric layer 122 that surrounds the channel pattern 130. The second gate electrode 221b may be formed to surround the first gate electrode 221a.

Work functions of the first gate electrode 221a and the second gate electrode 221b may be different from each other. For example, the first gate electrode 221a may include at least one of TiN and TiAlC, and the second gate electrode 221b may include tungsten (W).

Next, a method of manufacturing a semiconductor device according to an exemplary embodiment will be described in detail with reference to FIGS. 11 to 30.

FIGS. 11 and 14 to 30 illustrate cross-sectional views of stages in a method of manufacturing a semiconductor device according to an exemplary embodiment and taken along lines I-I' and II-II' of FIG. 1. Descriptions of components identical to the components described in FIGS. 1 to 3 may be omitted or briefly given.

Figure 11:
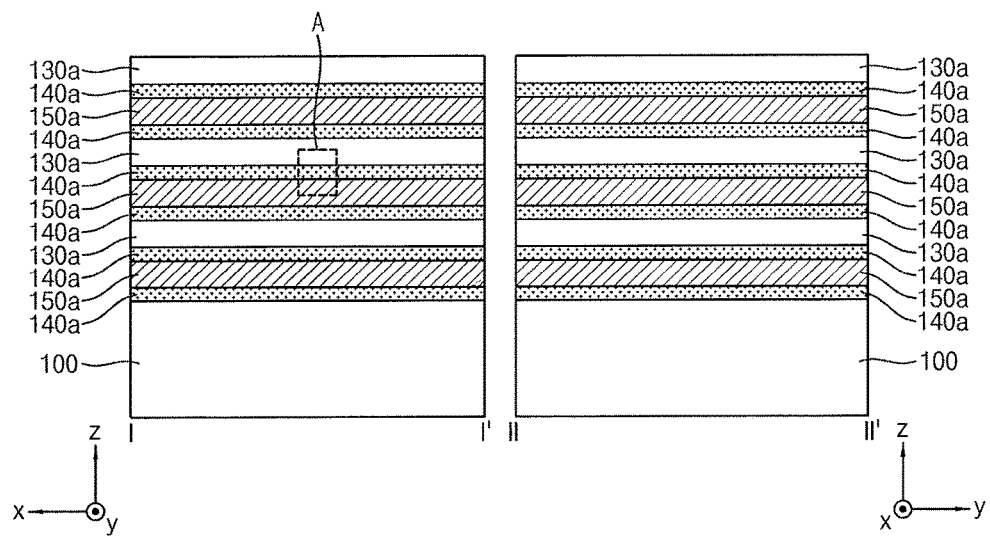
FIGS. 11 and 14 to 30 illustrate cross-sectional views of stages in a method of manufacturing a semiconductor device according to an exemplary embodiment and taken along lines I-I' and II-II' of FIG. 1.

As illustrated in FIG. 11, a process in which a sacrificial film 150a, an interface film 140a, and a channel film 130a are stacked and formed on a substrate 100 may be performed. For example, the sacrificial film 150a may be formed on the substrate 100, the interface film 140a containing carbon may be formed on the sacrificial film 150a, and the channel film 130a may be formed on the interface film 140a.

The interface film 140a may be formed between the channel film 130a and the sacrificial film 150a and between the sacrificial film 150a and the substrate 100. For example, the interface film 140a, the sacrificial film 150a, the interface film 140a, the channel film 130a, and the interface film 140a may be repeatedly stacked on the substrate 100 in the order described. In an implementation, as illustrated in FIGS. 8 and 9, when the first channel 331 is formed to be spaced apart from the substrate 100, the interface film 140a may be formed only between the sacrificial film 150a and the channel film 130a.

The channel film 130a, the interface film 140a, and the sacrificial film 150a may be formed using an epitaxial growth method. The sacrificial film 150a may be formed of a material having a lattice constant similar to the channel film 130a and an etch selectivity with respect to the channel film 130a. For example, when the channel film 130a is formed of epitaxial silicon, the sacrificial film 150a may be formed of epitaxial silicon germanium. When the channel film 130a is formed of epitaxial germanium or epitaxial silicon germanium, the sacrificial film 150a may be formed of epitaxial silicon.

A concentration of germanium contained in the sacrificial film 150a may be adjusted according to the material included in the channel film 130a. In an implementation, when the channel film 130a is formed of silicon, a concentration of germanium of the sacrificial film 150a may range from, e.g., 15 to 80 at %. In an implementation, when the channel film 130a is formed of germanium, a concentration of germanium of the sacrificial film 150a may range from, e.g., 0 to 80 at %. In an implementation, when the channel film 130a is formed of silicon germanium, a concentration of germanium of the sacrificial film 150a may be different by, e.g., 15 at % relative to a concentration of germanium of the channel film 130a. In an implementation, the channel film 130a and the sacrificial film 150a may not be formed of the same material and the same composition ratio.

The interface film 140a may contain carbon. When the channel film 130a or the sacrificial film 150a contains germanium, a phenomenon in which the germanium contained in the channel film 130a or the sacrificial film 150a is diffused into the adjacent sacrificial film 150a or the adjacent channel film 130a could occur due to heat and pressure generated in a manufacturing process when the semiconductor device is manufactured. In a final structure, a phenomenon in which the channel pattern 130 is structurally and/or compositionally non-uniform could occur. The semiconductor device according to an embodiment may include the interface film 140a (the interface layer 140) containing carbon having a higher mobility than that of germanium, and in the semiconductor device, the diffusion of germanium may be suppressed. A flatness of the channel film 130a may be increased by the interface film 140a. In an implementation, a concentration of carbon contained in each of the interface films 140a may range from, e.g., 0.01 at % to 5 at %. Maintaining the concentration of carbon at 0.01 at % or greater may help ensure that the diffusion of germanium is reduced and/or prevented. Maintaining the concentration of carbon at 5 at % or less may help secure crystallinity of carbon during an epitaxial growth.

Figure 12:
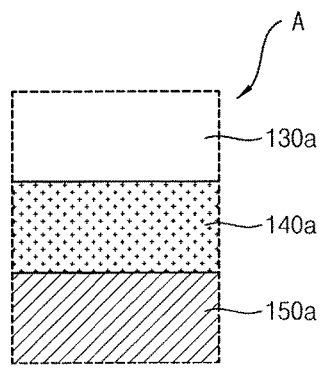
FIGS. 12 and 13 illustrate enlarged views of region A of FIG. 11.
Figure 13:
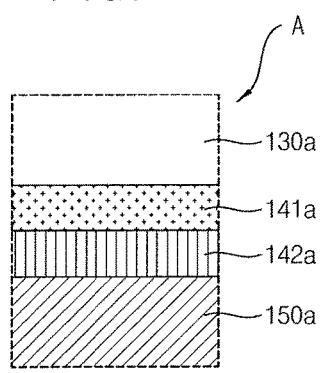

FIGS. 12 and 13 illustrate enlarged views of region A of FIG. 10. In an implementation, as illustrated in FIG. 12, the interface film 140a may be formed as a single film and may be formed with a silicon carbide film, a silicon germanium carbide film, or a combination thereof. In an implementation, as illustrated in FIG. 13, the interface film 140a may include a first interface film 141a and a second interface film 142a. For example, the first interface film 141a may be formed on a lower surface of the channel film 130a and the second interface film 142a may be formed on an upper surface of the sacrificial film 150a. The first interface film 141a and the second interface film 142a may be formed with a silicon carbide film or a silicon germanium carbide film according to the sacrificial film 150a and the channel film 130a. For example, when the sacrificial film 150a includes germanium or silicon germanium, the second interface film 142a may include silicon germanium carbide. When the channel film 130a includes germanium or silicon germanium, the first interface film 141a may include silicon germanium carbide.

Figure 14:
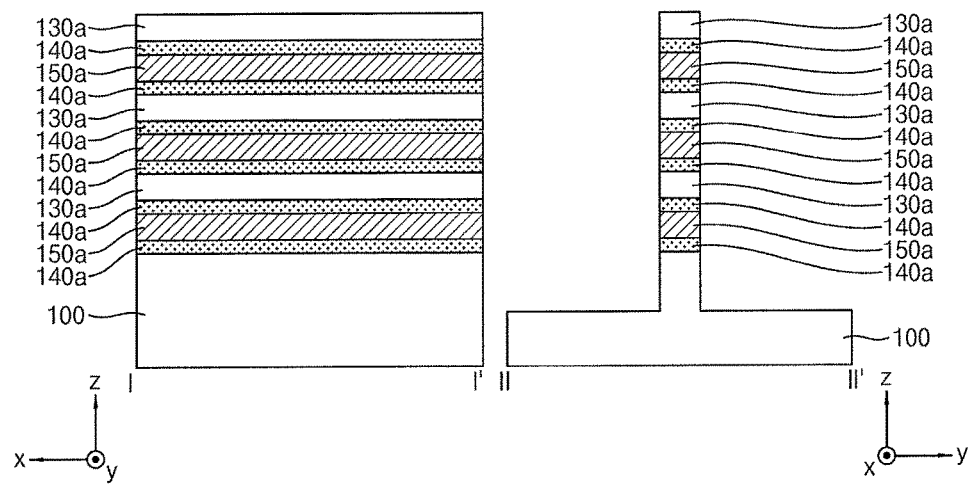

As illustrated in FIG. 14, a process in which the stacked layers and a portion of an upper portion of the substrate 100 are removed by a predetermined depth from the upper surface of the substrate 100 may be performed. Both side regions of each of the channel film 130a, the interface film 140a, and the sacrificial film 150a (which are stacked to pattern a fin shape extending in a first direction) may be removed. For example, after both side regions of each of the channel film 130a, the interface film 140a, and the sacrificial film 150a are removed first by performing an etching process using an etch mask, the upper portion of the substrate 100 may be removed by the predetermined depth.

Figure 15:
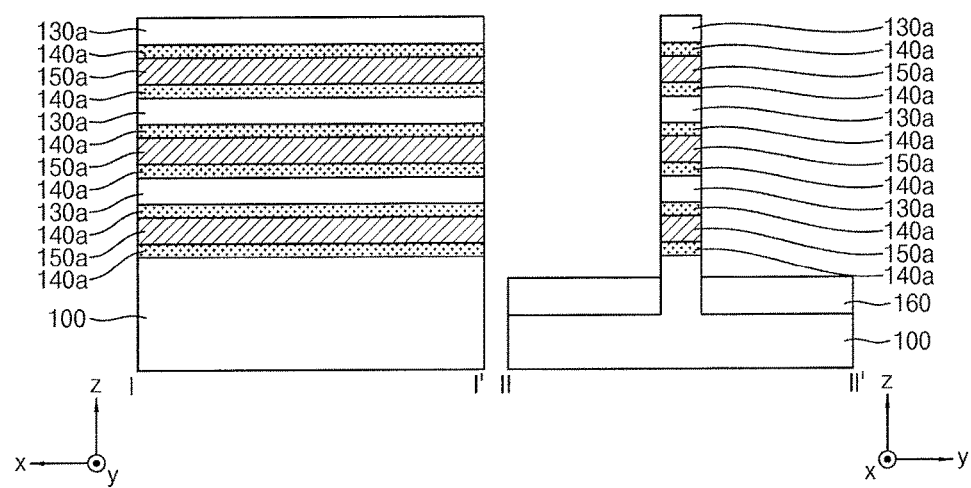

As illustrated in FIG. 15, a process in which a device isolation film 160 is formed may be performed. An insulating material for a device isolation film 160 may be deposited on the substrate 100 and planarized, and then a device isolation film is formed. For example, after an insulating material for a device isolation film 160, such as an oxide film, a nitride film, or an oxynitride film, may be formed in the region of the substrate 100, which is removed by the predetermined depth as illustrated in FIG. 14, by performing a chemical vapor deposition (CVD) process, a planarization process such as an etch-back or chemical mechanical polishing (CMP) process may be performed until a height of the device isolation film 160 becomes lower than a height of the upper surface of the substrate 100.

Figure 16:
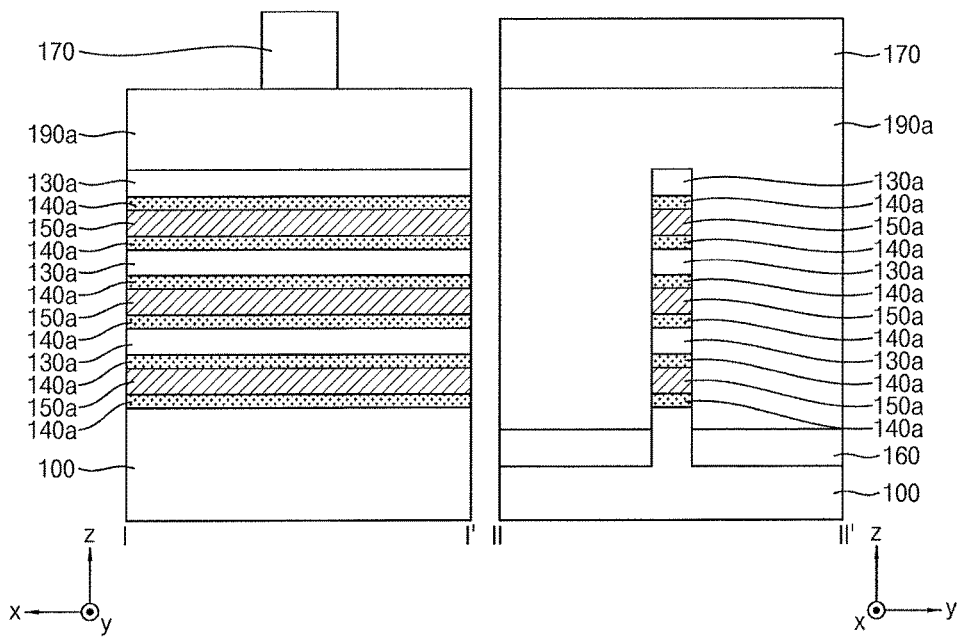

As illustrated in FIG. 16, a process in which a sacrificial gate film 190a and a mask pattern 170 are formed may be performed. The sacrificial gate film 190a, which covers the plurality of channel films 130a, the interface film 140a, and the sacrificial film 150a, may be formed on the device isolation film 160, and the mask pattern 170 may be formed on the sacrificial gate film 190a. For example, the sacrificial gate film 190a may be formed to surround an upper surface of the uppermost channel film 130a and side surfaces of the plurality of channel films 130a, side surfaces of the sacrificial film 150a, and side surfaces of the interface film 140a. The sacrificial gate film 190a may be formed using silicon oxide. The mask pattern 170 may be formed on an upper surface of the sacrificial gate film 190a to define a region in which a channel will be formed later.

Figure 17:
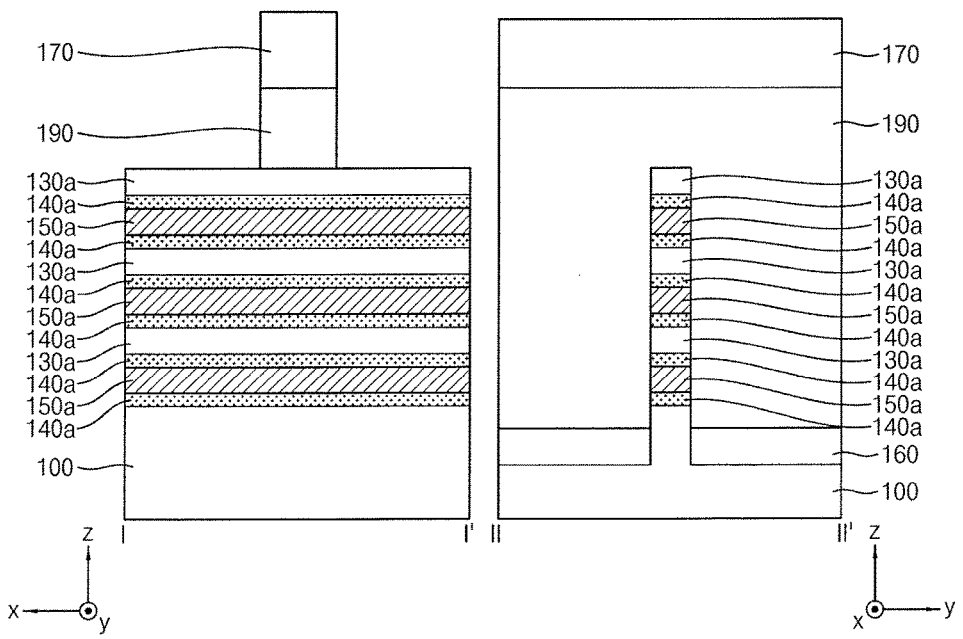

As illustrated in FIG. 17, a process in which a sacrificial gate pattern 190 is formed may be performed. The sacrificial gate pattern 190 may be formed by removing a portion of the sacrificial gate film 190a in which the mask pattern 170 is not formed. The sacrificial gate film 190a and the mask pattern 170 may have different etch selectivities. The mask pattern 170 may be used as a material that can be selectively etched with respect to the sacrificial gate film 190a. A portion of the sacrificial gate film 190a except for a region in which the mask pattern 170 is formed may be etched, and may be etched until the upper surface of the uppermost channel film 130a is exposed.

Figure 18:
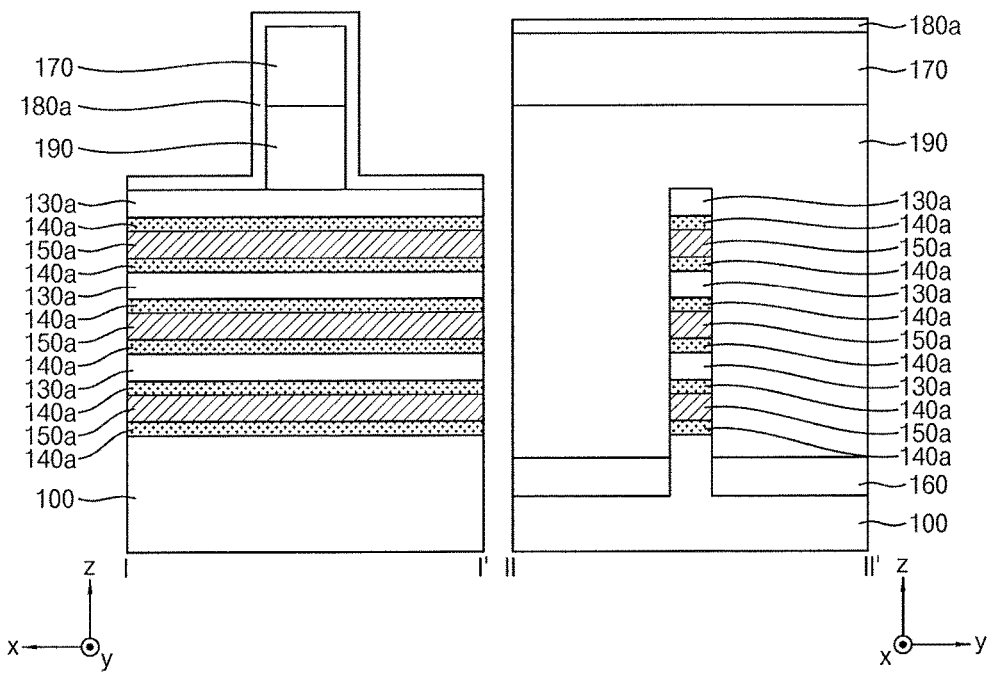

As illustrated in FIG. 18, a process in which a spacer film 180a is formed may be performed. The spacer film 180a may be formed on an exposed portion of the channel film 130a, the sacrificial gate pattern 190, and the mask pattern 170. For example, the spacer film 180a may be formed on an exposed portion of the upper surface of the uppermost channel film 130a, an upper surface and side surfaces of the mask pattern 170, and side surfaces of the sacrificial gate pattern 190. The spacer film 180a may be formed of silicon oxide, silicon nitride, or the like.

Figure 19:
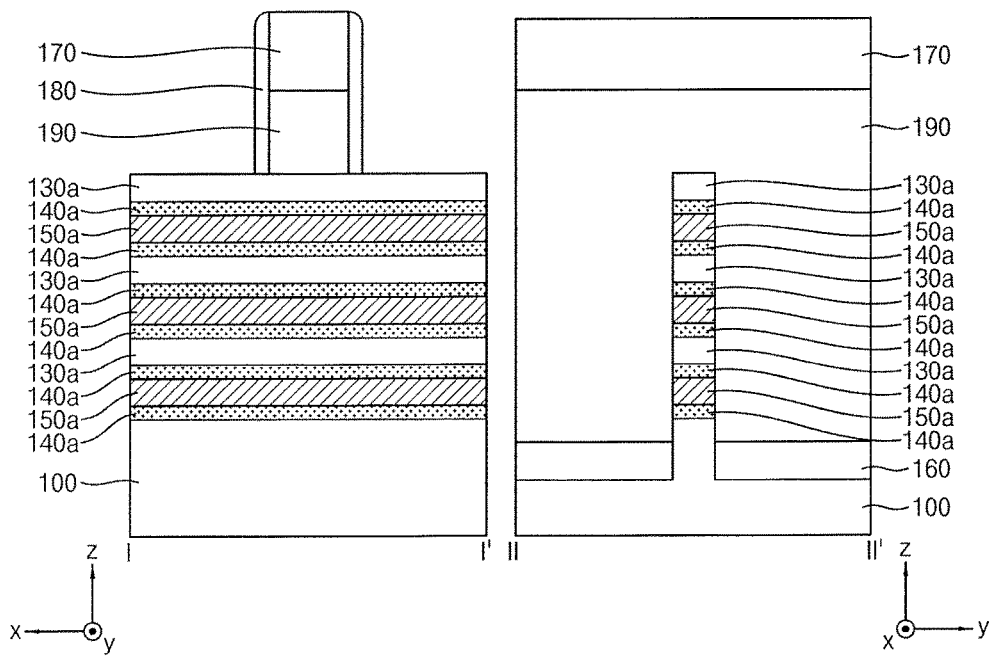

As illustrated in FIG. 19, a process in which a spacer 180 is formed through an etching process may be performed. For example, the spacer film 180a may be anisotropically etched in a vertical direction until the upper surface of the uppermost channel film 130a is exposed. The spacer 180 may be formed to cover the side surfaces of the sacrificial gate pattern 190 and the side surfaces of the mask pattern 170. A cross section of an upper end of the spacer 180 may be curved or inclined due to the etching in the vertical direction.

Figure 20:
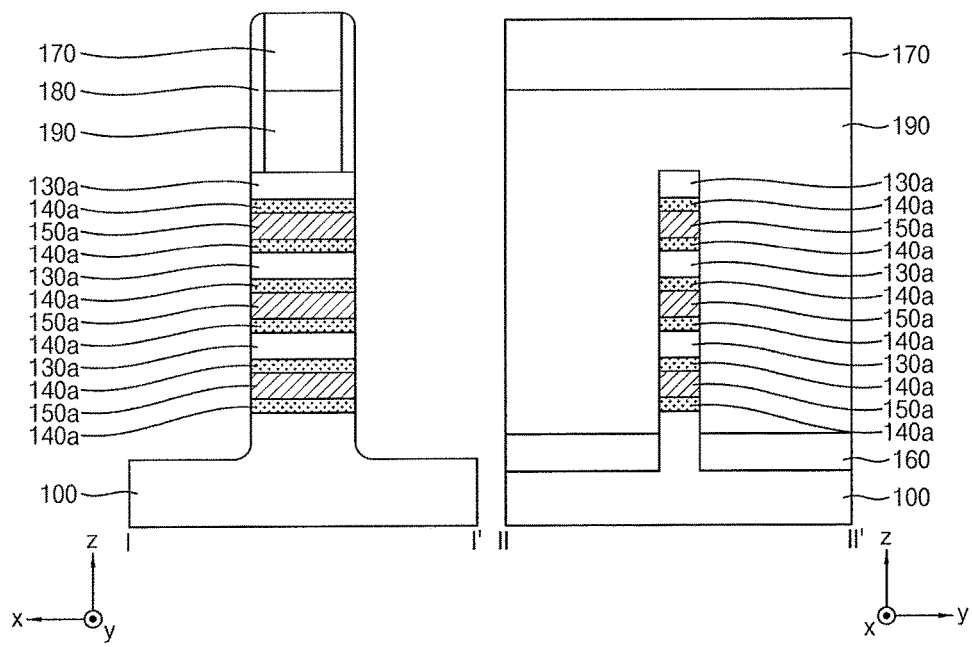

As illustrated in FIG. 20, a process in which a formation region of source/drain patterns 110 is defined may be performed. Portions of both side surfaces of each of the channel film 130a, the sacrificial film 150a, and the interface film 140a which are exposed because the sacrificial gate pattern 190 is not formed may be etched. The etching process may be performed until the height of the upper surface of the substrate 100 to be etched reaches a height between the upper surface of the device isolation film 160 and the lower surface of the device isolation film 160.

An etching gas may be appropriately selected so that the sacrificial gate pattern 190 may be used as an etch mask. For example, in the etching process, an etching gas having the same etch selectivity with respect to silicon and silicon germanium which are contained in the channel film 130a, the sacrificial film 150a, and the like and a high etch selectivity with respect to a silicon oxide film and a silicon nitride film which are contained in the sacrificial gate pattern 190 may be used.

Figure 21:
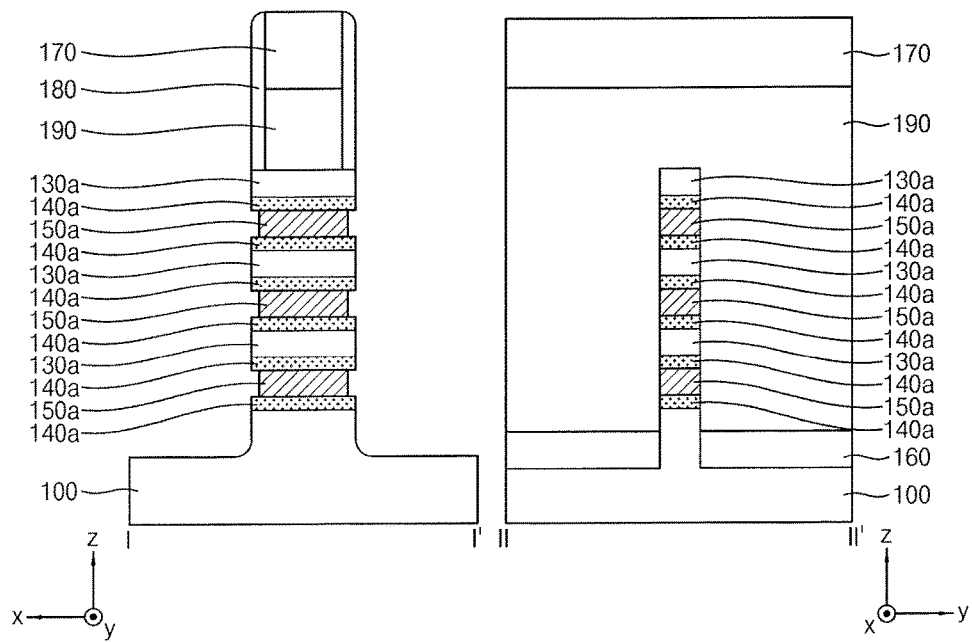

As illustrated in FIG. 21, a process in which the side surfaces of the sacrificial film 150a are exposed to remove portions of both side ends of the sacrificial film 150a may be performed. Both side ends of the sacrificial film 150a may be removed by performing a selective etching process, and an etchant process in which an etching speed with respect to the sacrificial film 150a is greater than an etching speed with respect to the channel film 130a may be used. Dimples that may be defined by the side surfaces of the sacrificial film 150a and the upper/lower surfaces of the interface film 140a may be generated. A recessed structure may be formed by the dimples in comparison with the channel film 130a or the interface film 140a.

Figure 22:
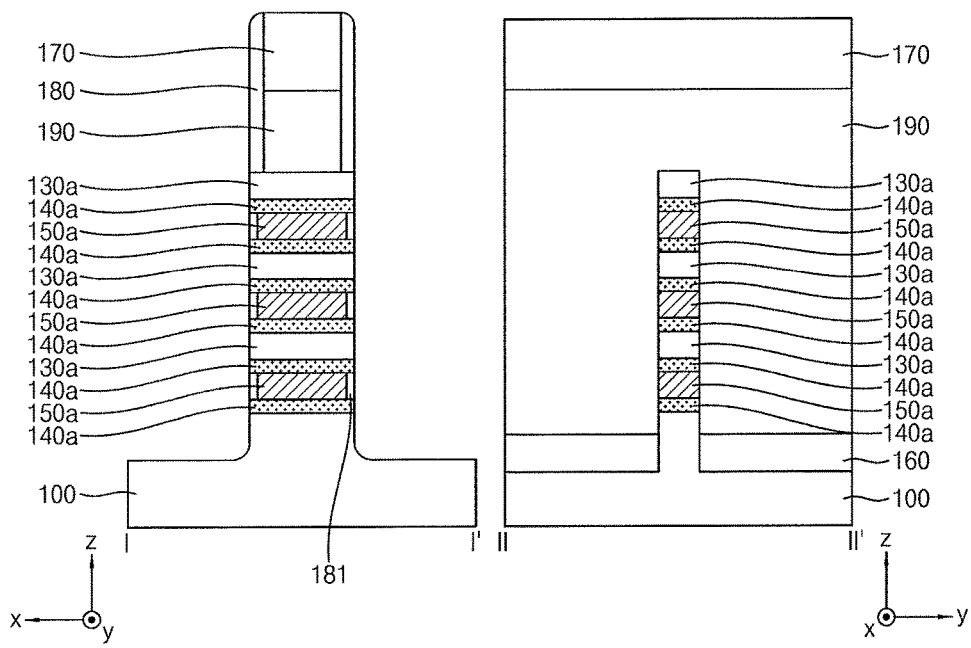

As illustrated in FIG. 22, a process in which the dimples are filled with an insulating material to form an inner spacer 181 may be performed. After the insulating material covers the spacer 180 and an outer side surface of the channel film 130a, the insulating material which covers the spacer 180 and the outer side surface of the channel film 130a except for the insulating material filled in the dimples may be removed by etching in the vertical direction. The inner spacer 181 may include a plurality of layers by repeatedly performing the process of the filling of the dimples with the insulating material and the removal of the insulating material, which covers the outer side surface of the channel film 130a, multiple times.

Figure 23:
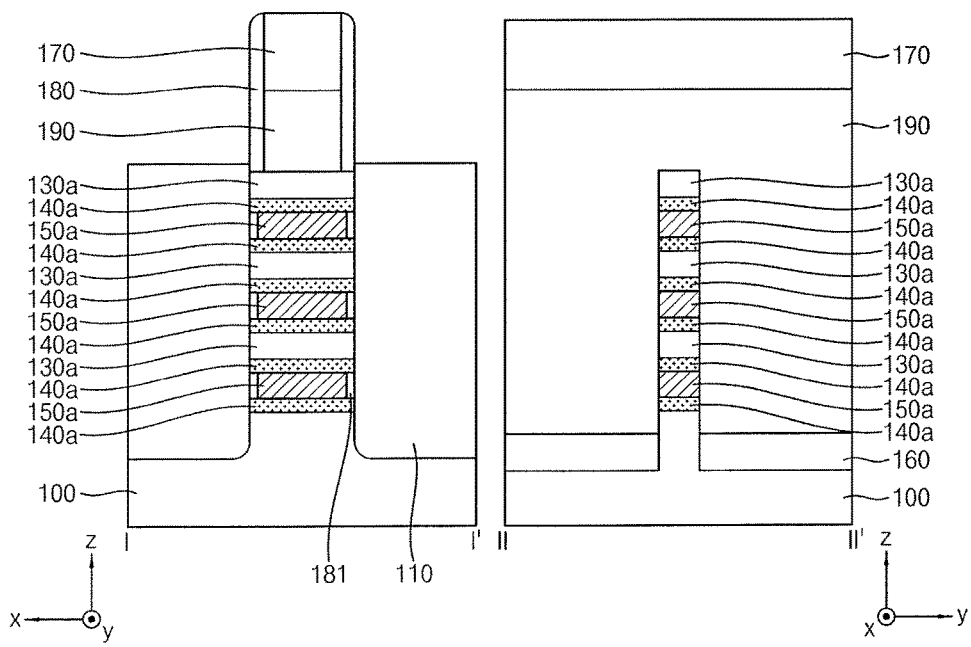

As illustrated in FIG. 23, a process in which source/drain patterns 110 are formed may be performed. Selective epitaxial growth (SEG) in which an epitaxial layer is selectively formed on the etched and exposed substrate 100 may be used. For example, when the semiconductor device is a P-MOS transistor, the source/drain patterns 110 may include silicon or silicon germanium. When the semiconductor device is an N-MOS transistor, the source/drain patterns 110 may include germanium or silicon carbide. The source/drain patterns 110 may be formed to have a greater height than the upper surface of the uppermost channel film 130a.

Figure 24:
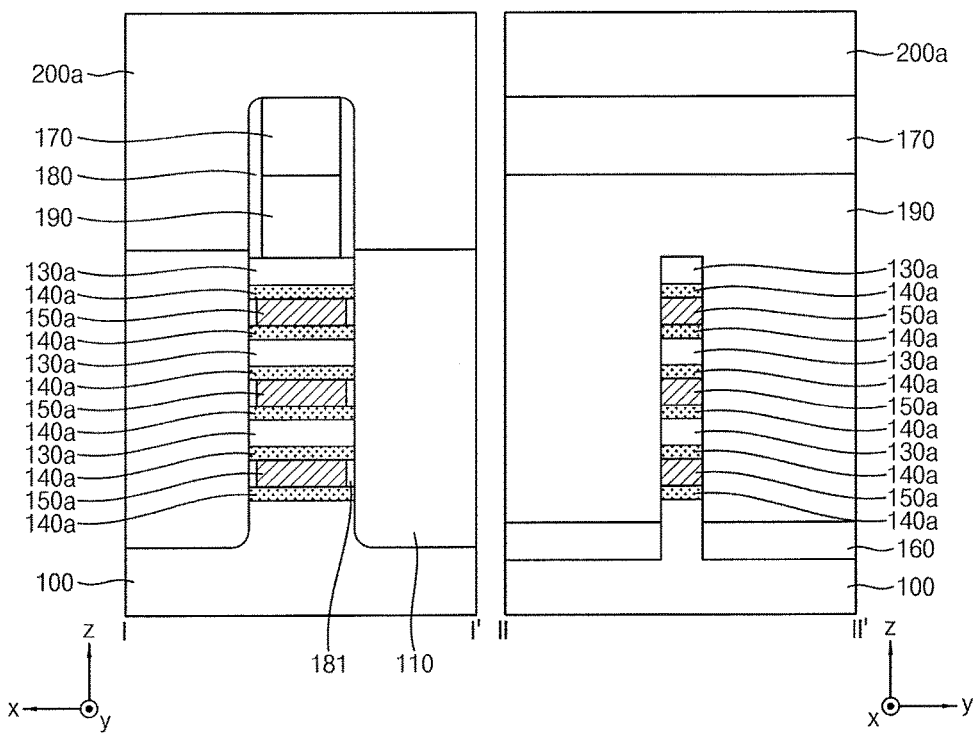

As illustrated in FIG. 24, a process in which an insulating film 200a is formed may be performed. The insulating film 200a may be formed in or on upwardly exposed regions. For example, the insulating film 200a may be formed on the upper surface of the source/drain patterns 110, the side surfaces of the spacer 180, and the upper surface of the mask pattern 170. The insulating film 200a may be formed using an insulating material such as silicon oxide through a deposition process or the like.

Figure 25:
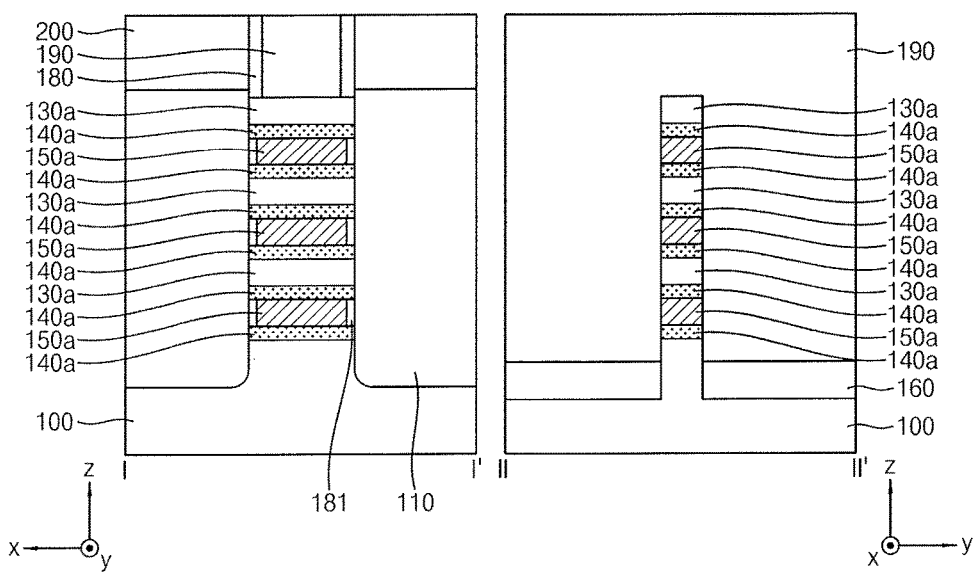

As illustrated in FIG. 25, a process in which the sacrificial gate pattern 190 is planarized until an upper surface thereof is exposed may be performed. A portion of the upper portion of the spacer 180 and the mask pattern 170 may be removed by the planarization process, and an insulating layer 200 may be formed by removing an upper portion of the insulating film 200a. For example, a CMP method or an etch-back method may be used in the planarization process.

Figure 26:
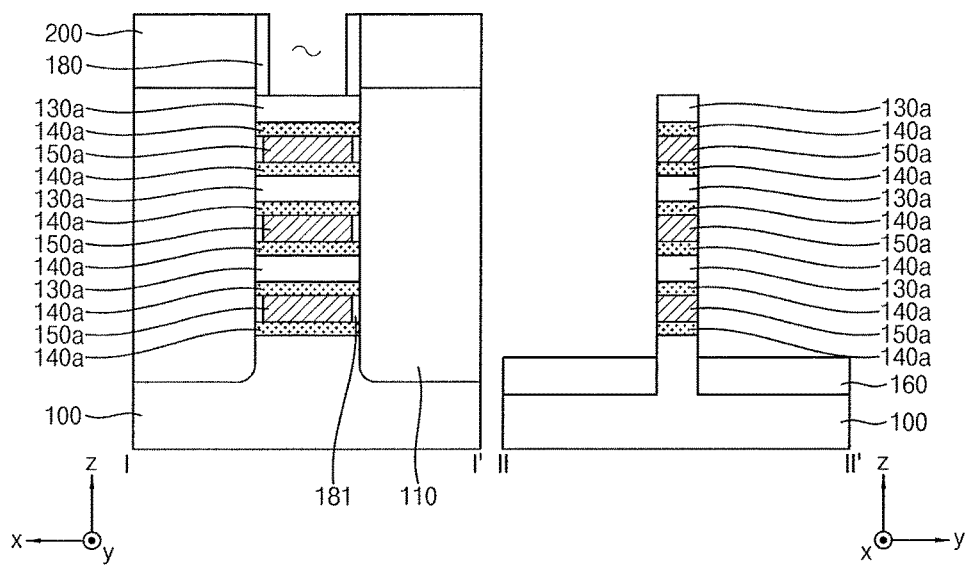

As illustrated in FIG. 26, a process in which the sacrificial gate pattern 190 is selectively removed may be performed. For example, the sacrificial gate pattern 190 may be removed using an etching process. When the sacrificial gate pattern 190 is removed, a space may be formed between the spacers 180. When the sacrificial gate pattern 190 is removed, the upper surface of the uppermost channel film 130a, the side surfaces of the plurality of channel films 130a, the side surfaces of the sacrificial films 150a, the side surfaces of the interface films 140a, and the upper surface of the device isolation film 160 may be exposed.

Figure 27:
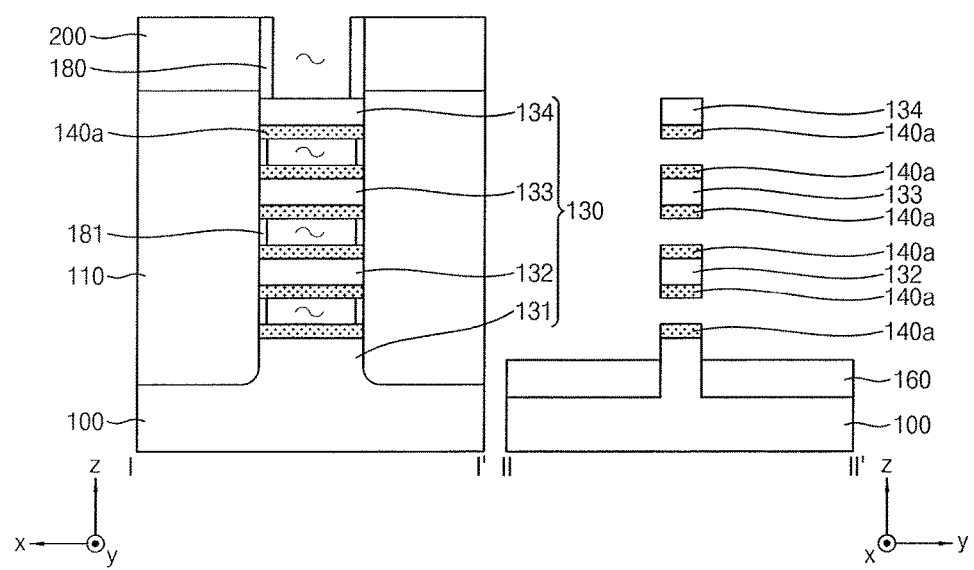

As illustrated in FIG. 27, a process in which the sacrificial films 150a are selectively removed may be performed. When the sacrificial films 150a are selectively removed, a space may be formed between the facing interface films 140a and the facing interface films 140a may be exposed. In an implementation, the inner spacer 181 may be formed in portions of the side surfaces of the source/drain patterns 110 and may help prevent the portions of the side surfaces of the source/drain patterns 110 from being exposed. The inner spacer 181 may help prevent the portions of the side surfaces of the source/drain patterns 110 from being removed together while removing the sacrificial film 150a. In an implementation, the first to fourth channels 131, 132, 133, and 134, e.g., the channel pattern 130, which connect the source/drain patterns 110, may be formed, and the interface layer 140 may be formed on an upper surface and a lower surface of each of the first to fourth channels 131, 132, 133, and 134. In an implementation, a cross section of the channel pattern 130 may be rectangular.

The removal of the sacrificial film 150a may include performing a wet etching or chemical dry etching process through the exposed surface of the sacrificial film 150a. In order to selectively remove the sacrificial film 150a, an etch selectivity of the channel film 130a and an etch selectivity of the sacrificial film 150a may be different from each other. For example, when the channel film 130a and the sacrificial film 150a include silicon and silicon germanium, respectively, a mixed solution containing hydrogen peroxide, hydrogen fluoride, and acetic acid may be used as an etching solution.

Figure 28:
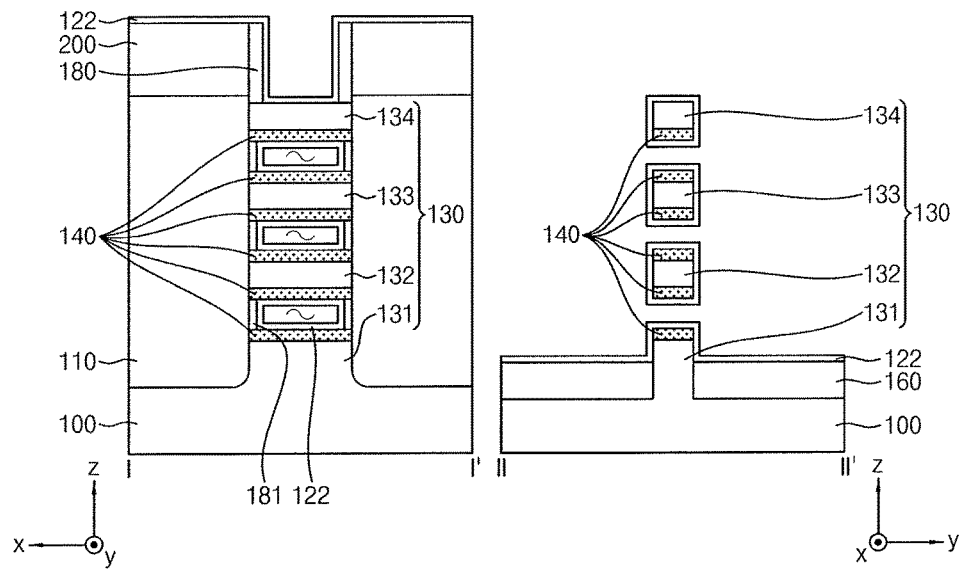

As illustrated in FIG. 28, a process in which a gate dielectric layer 122 is formed on the channel pattern 130 may be performed. For example, the gate dielectric layer 122 may be formed by depositing a high-k material having a higher dielectric constant than silicon oxide, such as hafnium oxide (HfO$_2$), lanthanum oxide (La$_2$O$_3$), zirconium oxide (ZrO$_2$), or tantalum oxide (Ta$_2$O$_5$), thereon using an atomic layer deposition (ALD) process. In this case, the gate dielectric layer 122 may be formed on exposed portions in the spacer 180, the insulating layer 200, and the like as well as on a portion in which the channel is exposed. For example, the gate dielectric layer 122 may be formed on the upper surface and the lower surface of the interface layer 140, the side surfaces of the channel pattern 130, the upper surface of the device isolation film 160, the portions of the side surfaces of the source/drain patterns 110, the side surfaces of the spacer 180, and the upper surface of the insulating layer 200.

The gate dielectric layer 122 may also be formed by a thermal oxidation process or a CVD process. When the thermal oxidation process or the CVD process is performed, the gate dielectric layer 122 may not be formed on the insulating layer 200, the device isolation film 160, and the spacer 180.

Figure 29:
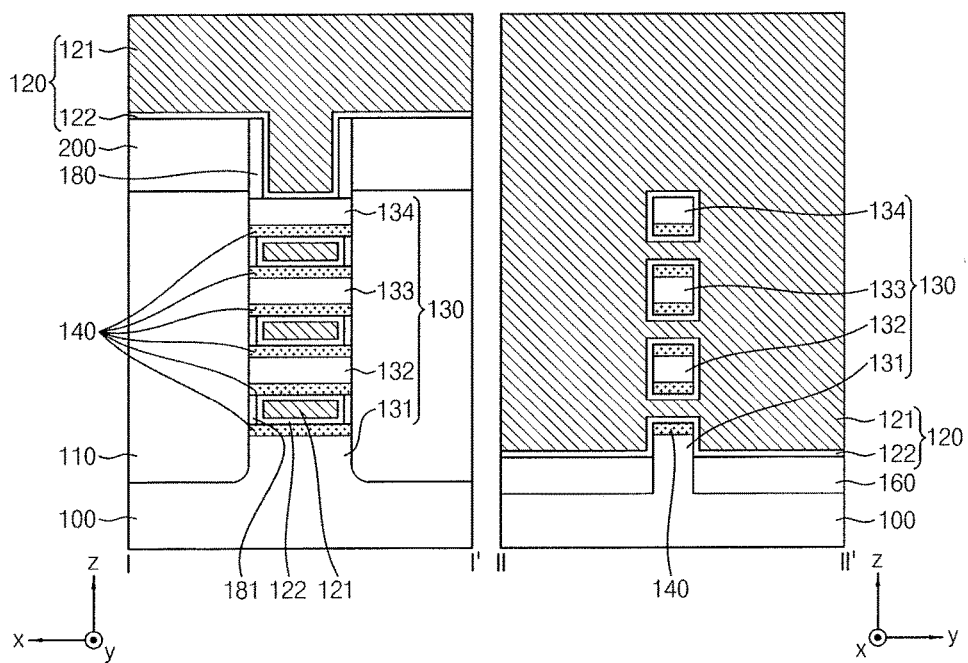

As illustrated in FIG. 29, a process in which a gate electrode 121 is formed on the gate dielectric layer 122 may be performed. The gate electrode 121 may be formed to fill a space between the spacers 180 and a space between the channel pattern 130. The gate electrode 121 may cover the insulating layer 200 and the spacer 180 while surrounding the channel pattern 130. For example, the gate electrode 121 may include polysilicon doped with impurities using a deposition process or a metal such as aluminum (Al), nickel (Ni), tungsten (W), titanium (Ti), tantalum (Ta), or the like, and may be formed of a conductive material such as titanium nitride (TiN), tantalum nitride (TaN), titanium carbide (TiC), tantalum carbide (TaC), or the like.

In an implementation, the gate electrode 221 may be formed to include the first gate electrode 221*a* and the second gate electrode 221*b*, which have different work functions from each other, as illustrated in FIG. 10. For example, the first gate electrode 221*a* may be formed to surround the gate dielectric layer 122, and then the second gate electrode 221*b* may be formed.

Figure 30:
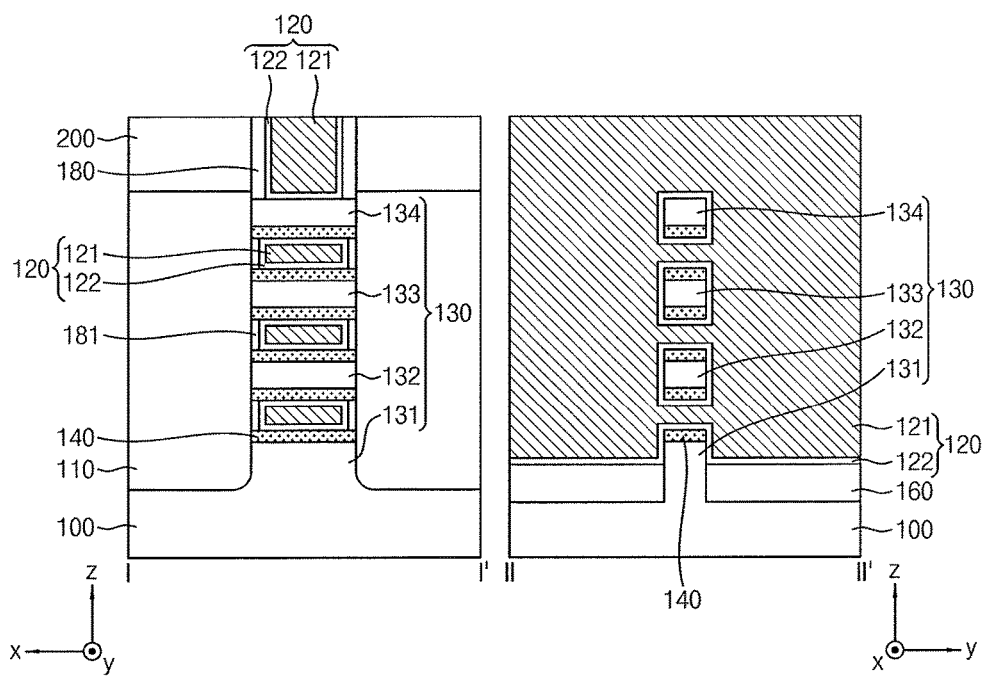

As illustrated in FIG. 30, a planarization process in which the gate electrode 121 is formed to have the same height as the insulating layer 200 may be performed. The gate dielectric layer 122 formed on the insulating layer 200 may also be removed through the planarization process of the gate electrode 121. The gate electrode 121 may be appropriately patterned according to a user's design.

Next, a method of manufacturing a semiconductor device according to an exemplary embodiment will be described in detail with reference to FIGS. 31 to 34.

FIGS. 31 to 34 illustrate cross-sectional views of stages in a method of manufacturing a semiconductor device and taken along lines I-I' and II-II' of FIG. 1. In describing the exemplary embodiment, descriptions of components identical to the above-described components may be omitted or briefly given. The method according to the exemplary embodiment may be the same as or similar to the manufacturing method described with reference to FIGS. 11 to 27, and a repeated description thereof may be omitted. Also, descriptions of processes identical to the above-described processes may be briefly given.

Figure 31:
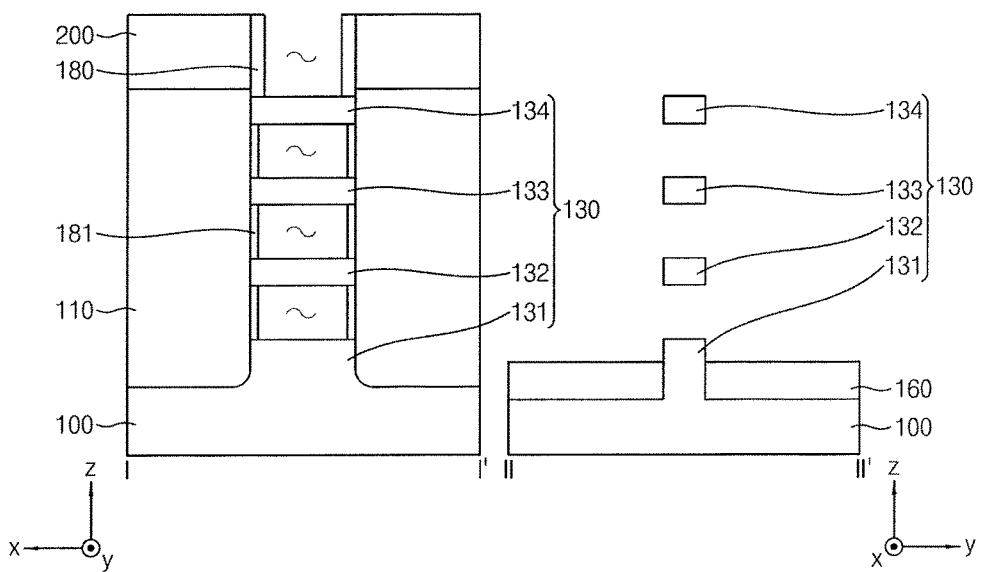
FIGS. 31 to 34 illustrate cross-sectional views of stages in a method of manufacturing a semiconductor device according to an exemplary embodiment and taken along lines I-I' and II-II' of FIG. 1.

As illustrated in FIG. 31, a process in which the interface layer 140 is removed may be performed. When the interface layer 140 is removed, an upper surface of the first channel 131, upper surfaces and lower surfaces of the second and third channels 133, and a lower surface of the fourth channel 134 may be exposed.

The interface layer 140 may be selectively removed using a hydrogen bake treatment or a hydrogen plasma treatment. For example, the hydrogen bake treatment may be performed at a temperature of about 750° C. to 830° C. and a pressure of about 100 torr to 300 torr for 30 seconds to 10 minutes. In this case, the temperature may be increased from an initial temperature of 500° C. with a ramping rate of 0.1 degrees to 10 degrees. The hydrogen plasma treatment may be performed with a power of about 5 kW to 50 kW at a temperature in a range of about 300° C. to 700° C. and a frequency of about 0.5 GHz to 5 GHz for 5 seconds to 10 minutes.

Figure 32:
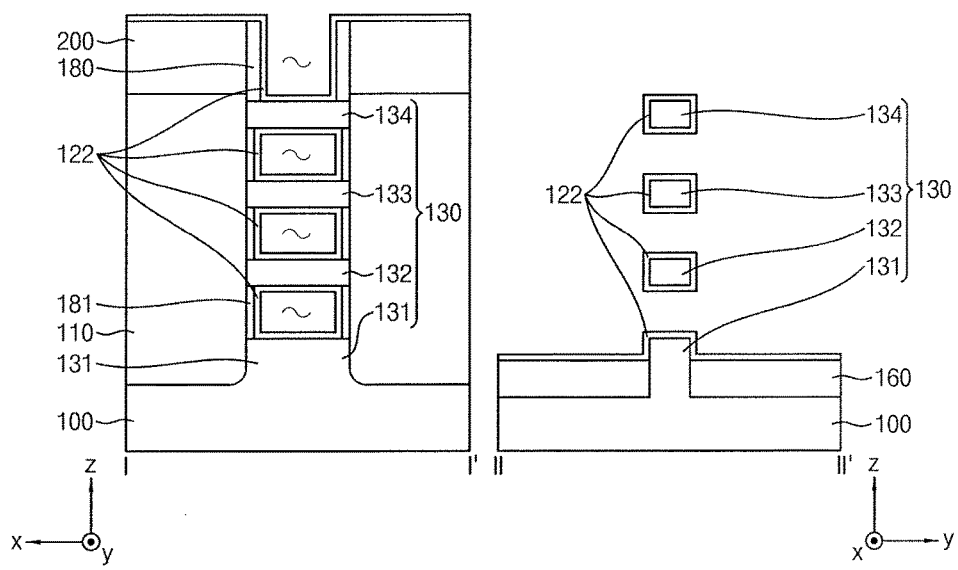

As illustrated in FIG. 32, a process in which a gate dielectric layer 122 is formed on the channel pattern 130 may be performed. The gate dielectric layer 122 may be formed on the upper surface, the lower surface, and the side surfaces of the channel pattern 130, the upper surface of the device isolation film 160, the portions of the side surfaces of the source/drain patterns 110, the side surfaces of the spacer 180, and the upper surface of the insulating layer 200.

Figure 33:
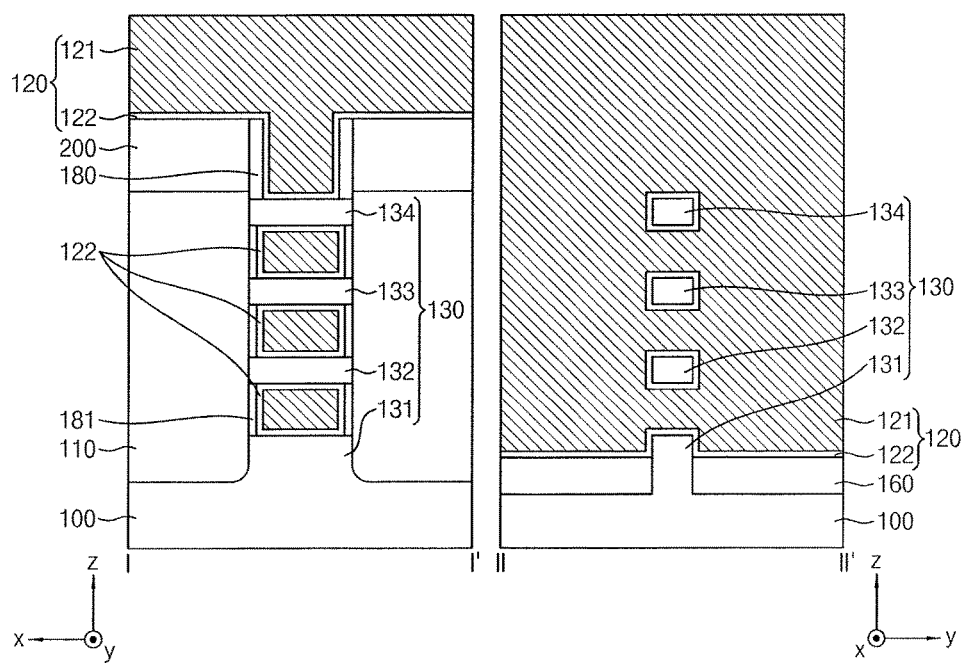
Figure 34:
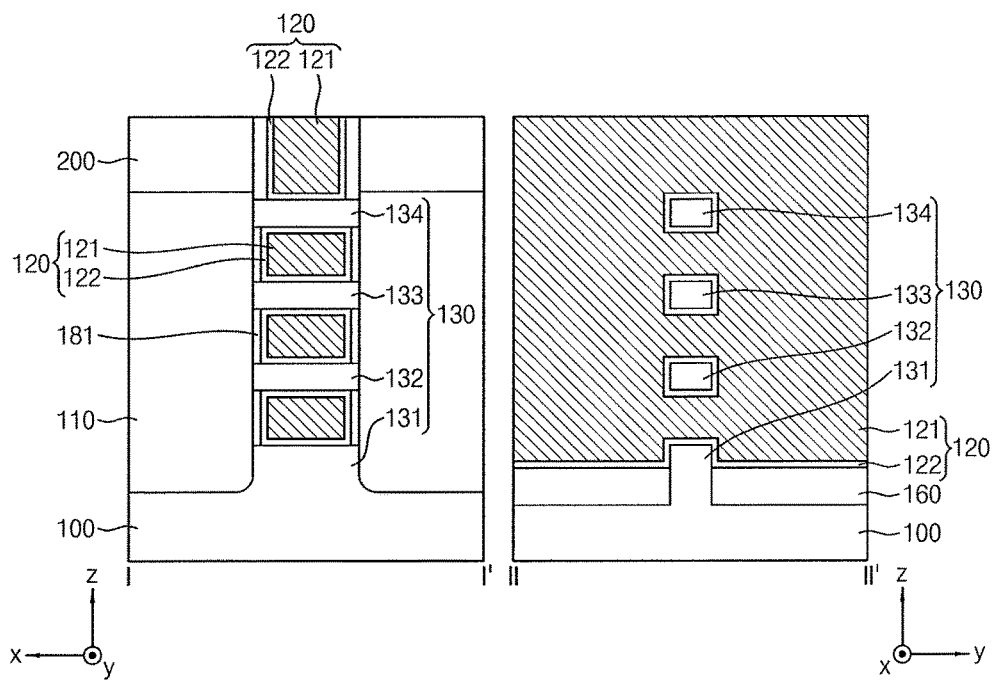

As illustrated in FIG. 33, a process in which a gate electrode 121 is formed on the gate dielectric layer 122 may be performed. In an implementation, the gate electrode 221 may be formed to include the first gate electrode 221*a* and the second gate electrode 221*b* which have different work functions from each other, as illustrated in FIG. 10. As illustrated in FIG. 34, a planarization process in which the gate electrode 121 is formed to have the same height as the insulating layer 200 may be performed. The gate dielectric layer 122 formed on the insulating layer 200 may also be removed through the planarization process of the gate electrode 121. The gate electrode 121 may be appropriately patterned according to the user's design.

Figure 35:
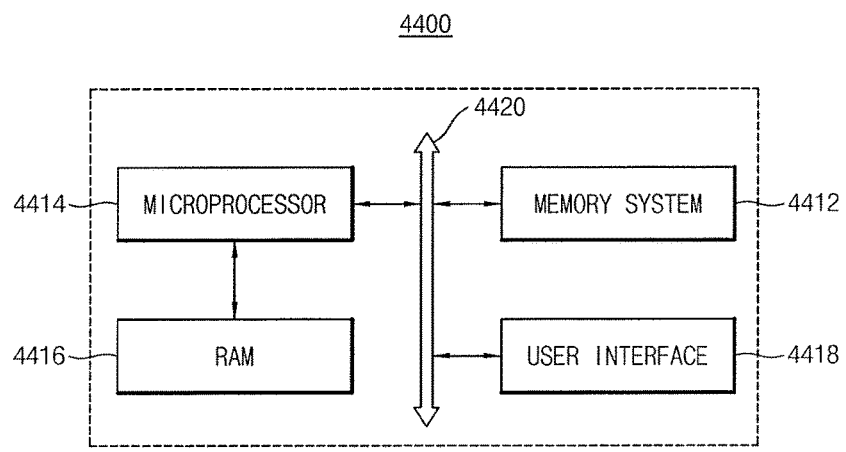
FIG. 35 illustrates a block diagram of an electronic system including the semiconductor device according to the exemplary embodiments.

FIG. 35 illustrates a block diagram of an electronic system 4400 including the semiconductor device according to the exemplary embodiments.

Referring to FIG. 35, the electronic system 4400 may include a memory system 4412, a microprocessor 4414, a random access memory (RAM) 4416, a user interface 4418, and a bus 4420. The microprocessor 4414 may program and control the electronic system 4400. The RAM 4416 may be used as an operating memory of the microprocessor 4414. The microprocessor 4414, the RAM 4416, and/or other components may be assembled into a single package. The user interface 4418 may serve to input/output data to/from the electronic system 4400. The memory system 4412 may serve to store operating codes of the microprocessor 4414, data processed by the microprocessor 4414, or external input data. The memory system 4412 may include a controller and a memory.

The electronic system 4400 may be applied to a mobile device or a computer. In the exemplary embodiments, the semiconductor device described with reference to FIGS. 1 to 31 may be included in at least one of the RAM 4416, the memory system 4412, and the microprocessor 4414 to improve performance with respect to price of the electronic system 4400.

According to the exemplary embodiments, an interface layer containing a blocking material and formed on a plurality of channels is provided, and thus a flatness of the channels can be increased. In a semiconductor device, diffusion of germanium contained in a sacrificial film or a channel film may be prevented by the interface layer. In an embodiment, a highly integrated semiconductor device with secured operation reliability of channels, and a method of manufacturing the same can be provided.

The embodiments may provide a semiconductor device capable of increasing a flatness of a channel in a plurality of channels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a channel pattern on a substrate, the channel pattern extending in a first direction;
a gate pattern on the substrate, the gate pattern extending in a second direction crossing the first direction and surrounding the channel pattern; and
an interface layer between the channel pattern and the gate pattern, the interface layer being formed on at least one surface of an upper surface and a lower surface of the channel pattern,
wherein the interface layer contains carbon (C) or boron (B),
wherein:
the channel pattern includes silicon,
the interface layer includes germanium, and
a concentration of germanium in the interface layer decreases toward the channel pattern.

2. The semiconductor device as claimed in claim 1, wherein the interface layer includes a silicon germanium carbide (SiGeC) layer.

3. The semiconductor device as claimed in claim 2, wherein a concentration of the carbon in the interface layer ranges from 0.01 at % to 5 at %.

4. The semiconductor device as claimed in claim 1, wherein a cross section of the channel pattern has a rectangular shape or trapezoidal shape.

5. The semiconductor device as claimed in claim 1, wherein:
the gate pattern includes:
a gate electrode, and
a gate dielectric layer between the gate electrode and the channel pattern, and
the interface layer is between the channel pattern and the gate dielectric layer.

6. The semiconductor device as claimed in claim 1, wherein a thickness of the interface layer is smaller than a thickness of the channel pattern.

7. The semiconductor device as claimed in claim 1, wherein the interface layer is in direct contact with the channel pattern.

8. A semiconductor device, comprising:
a channel pattern on a substrate, the channel pattern extending in a first direction;
a gate pattern on the substrate, the gate pattern extending in a second direction crossing the first direction and surrounding the channel pattern; and
an interface layer between the channel pattern and the gate pattern, the interface layer being formed on at least one surface of an upper surface and a lower surface of the channel pattern,
wherein the interface layer contains carbon (C) or boron (B),
wherein:
the channel pattern includes silicon germanium, germanium, or a combination thereof,
the interface layer includes germanium, and
a concentration of germanium in the interface layer increases toward the channel pattern.

9. The semiconductor device as claimed in claim 8, wherein the interface layer includes a silicon germanium carbide (SiGeC) layer.

10. The semiconductor device as claimed in claim 9, wherein a concentration of the carbon in the interface layer ranges from 0.01 at % to 5 at %.

11. The semiconductor device as claimed in claim 8, wherein a cross section of the channel pattern has a rectangular shape or trapezoidal shape.

12. The semiconductor device as claimed in claim 8, wherein:
the gate pattern includes:
a gate electrode, and
a gate dielectric layer between the gate electrode and the channel pattern, and
the interface layer is between the channel pattern and the gate dielectric layer.

13. The semiconductor device as claimed in claim 8, wherein a thickness of the interface layer is smaller than a thickness of the channel pattern.

14. The semiconductor device as claimed in claim 8, wherein the interface layer is in direct contact with the channel pattern.

15. A method of manufacturing a semiconductor device, the method comprising:
forming a sacrificial film on a substrate;
forming an interface film on the sacrificial film such that the interface film includes carbon;
forming a channel film on the interface film;
removing the sacrificial film;
removing the interface film; and
forming a gate pattern such that the gate pattern surrounds the channel film.

16. The method as claimed in claim 15, wherein removing the interface film includes performing a hydrogen bake treatment or a hydrogen plasma treatment.

* * * * *